(12) United States Patent
Post et al.

(10) Patent No.: US 6,493,933 B1
(45) Date of Patent: Dec. 17, 2002

(54) METHOD OF MAKING FLEXIBLE ELECTRONIC CIRCUITRY

(75) Inventors: E. Rehmi Post, Cambridge; Neil Gershenfeld, Somerville, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/691,739

(22) Filed: Oct. 18, 2000

Related U.S. Application Data

(60) Provisional application No. 60/160,140, filed on Oct. 18, 1999.

(51) Int. Cl.[7] .................................................. H05K 3/10
(52) U.S. Cl. .............................. 29/846; 29/825; 29/832
(58) Field of Search .......................... 29/846, 852, 825, 29/832

(56) References Cited

U.S. PATENT DOCUMENTS

| | | | |
|---|---|---|---|
| 2,050,298 A | 8/1936 | Everett | |
| 3,160,790 A | 12/1964 | Mittler | 317/101 |
| 3,371,250 A | 2/1968 | Ross et al. | |
| 3,478,425 A | 11/1969 | Cooke | |
| 3,631,298 A | 12/1971 | Davis | |
| 4,239,046 A | 12/1980 | Ong | 128/640 |
| 4,761,005 A | 8/1988 | Franch et al. | 273/1 GC |
| 4,963,768 A | 10/1990 | Agrawal et al. | 307/465 |
| 5,086,335 A | 2/1992 | Leibovitz et al. | |
| 5,499,927 A | 3/1996 | Ohno et al. | 439/285 |
| 5,774,341 A | 6/1998 | Urbish et al. | 361/774 |
| 5,802,607 A | 9/1998 | Triplette | 2/1 |
| 5,843,567 A | 12/1998 | Swift et al. | 428/221 |

FOREIGN PATENT DOCUMENTS

| | | |
|---|---|---|
| DE | 19755792 | 6/1999 |
| JP | 61198798 | 3/1986 |
| JP | 1072545 | 3/1989 |
| JP | 03048449 | 1/1991 |
| JP | 11168268 | 6/1999 |
| JP | 11225119 | 8/1999 |

OTHER PUBLICATIONS

"Zipper Connector," IBM Technical Disclosure Bulletin, vol. 34, No. 7B, Dec. 1991.

Inaba et al., "A Full–Body Tactile Sensor Suit Using Electrically Conductive Fabric and Strings," Proc. Of IROS 96 at 450 (1996).

Primary Examiner—Carl J. Arbes
(74) Attorney, Agent, or Firm—Testa, Hurwitz & Thibeault, LLP

(57) ABSTRACT

Stitchable electrical components have flexible, conductive leads and are encased, at least partially, in sealed packages. Conductive threads, yarns, or fiber bundles are patterned onto a flexible substrate (e.g., a textile panel). To form a circuit, the component leads are conductively stitched, spot welded, or otherwise joined to a textile panel so as to form connections between at least some of the stitched leads so as to form an electrical circuit. Alternatively, leads stitched into or otherwise joined to a textile pattern may be welded or otherwise permanently joined to flexible or non-flexible component leads to form a circuit. Multiple panels of circuitry so formed may then be physically and electrically joined at various locations by a combination of stitching, welding, and/or other joining means, preferably with interposed insulating layers, to form a multilayer flexible circuit.

19 Claims, 3 Drawing Sheets

METHOD OF MAKING FLEXIBLE ELECTRONIC CIRCUITRY

RELATED APPLICATION

This application claims the benefits of U.S. Ser. No. 60/160,140, filed on Oct. 18, 1999.

FIELD OF THE INVENTION

The present invention relates to fabrication of electronic devices and circuits, and in particular to their integration into wearable textiles.

BACKGROUND OF THE INVENTION

Electrical circuits are typically assembled by soldering active and passive components onto solid boards. The components receive power and exchange signals by means of a network of conductive metal traces patterned, typically, in multiple layers on the board. This approach to circuit fabrication, while virtually universal, nonetheless limits the manner in which electronic devices are housed and used. Generally, rigid boards are contained within an equally rigid cabinet, which sits on, or serves as, a piece of the user's furniture. Indeed, the notion of electronics being packaged in "boxes" is so ubiquitous that alternatives are difficult to imagine.

But as the miniaturization of circuits continues, and as the range of materials from which electronic components may be formed expands, alternatives to traditional housings will assume increasing importance. In particular, much current work involving user-interface design attempts to bring electronic sensing and display circuitry into more intimate contact with users; this allows the functioning of electronic devices to become a natural part of everyday action and routine, sparing users the need to deliberately "operate" an external system, and rendering interaction with digital articles as natural as interaction with their traditional counterparts.

Such an approach also increase the range of useful tasks amenable to digital mediation: environmental and location monitoring, information storage, processing, and mediation, and short- or long-range digital communication all may be effected without effort by the user or proximity to an external electronic device. Thus, by associating circuitry with the user rather than requiring the user to seek out the circuitry, the user is relieved of the need to interrupt or modify ordinary behavior to interact with electronics; instead, the electronics conforms to the behavior of the user.

Integrating electronic circuitry within textiles poses difficult engineering issues if the desirable characteristics of fabric are to be combined with presently available electronic components. For example, fabrics can assume a wide variety of textures and appearances, as well as shapes and volumes; they are flexible, accommodate stress and movement without damage, and can be laundered. It is just these characteristics that traditional modalities for mounting electronic components lack. Thus, directly integrating stiffly mounted electronic circuitry into traditional textiles would defeat their fundamental appeal.

Historically, solder and solder joints have been the method of choice for providing electrical and mechanical interconnections in electrical and electronic devices. This operation (well known to those skilled in the art) is typically accomplished at temperatures of 200° mto 300° C. with an alloy of tin, lead, and/or silver combined with a soldering flux. The solder cools to provide not only a semipermanent electrical pathway between metallic component leads and metallic printed circuit contacts, but also the sole mechanical attachment of components to the circuit substrate. This approach has several disadvantages in the context of wearable and textile applications, chief among which are the issues of lead toxicity, the high temperatures involved (which would damage most wearable fabrics), and the rigidity of metal-to-metal solder joints which form stress concentration points when the system is flexed, folded, or sheared.

Copending application Ser. no. 08/935,466, filed on Sep. 24, 1997, discloses a variety of approaches toward integrating electrical circuitry with traditional textiles. In general, conductive fibers are integrated within the weave of the textile, serving as a substrate for the attachment of electronic components and providing connections therebetween. In particular, leads from electronic components are soldered, adhered, or fastened to the conductive fibers, which serve as electrical conduits capable of carrying data signals and/or power. In an alternative approach, the electrical conduits are strips of conductive fabric attached to a non-conductive fabric substrate.

Conventional "flex" circuits are typically formed by laminating alternating layers of patterned copper and polyimide. These flex circuits typically have a minimum bending radius beyond which permanent deformation or delamination will occur, so their range of motion must be constrained by the encompassing system. Furthermore, components must be placed on conventional flex circuits to avoid areas where differential flexure will stress mechanical connections between circuitry and components.

Electrical interconnects patterned in fabric substrates must be mechanically compatible with the substrate in order to retain the desirable properties of flexibility and durability that fabric provides, which properties are superior to those provided by existing flexible circuitry. Clearly it would be desirable to provide an electrical and mechanical interconnection that solves the problem of lead toxicity, does not need to be assembled at high temperatures, and provides a good "mechanical impedance match" between substrate, interconnect, and components.

DESCRIPTION OF THE INVENTION

Brief Summary of the Invention

In accordance with the present invention, electrical circuits are created on ordinary, non-conductive fabric using electronic components with flexible leads that are conductively stitched into the fabric, and conductive traces also formed by stitching. This approach not only permits integration of electronics with conventional fabrics, but also preserves the fabric character of the final article. Moreover, the operative electronic elements of the components are preferably contained within watertight packages, allowing the fabric and circuitry affixed thereto to be laundered in any conventional manner. The packages themselves may be round or polygonal (i.e., having three or more straight sides).

The present invention can also realize the benefits of multiple-layer circuit construction. In conventional circuitry, each board layer is printed or etched in copper on one side of a thin insulating substrate, and the substrates are then laminated together; holes are drilled where layers are to interconnect, and are plated to form electrically conductive "vias." In accordance with the present invention, fabric layers having conductive traces thereon are separated from each other by nonconductive sheets, and the layers are conductively stitched where the traces of different layers are to make contact.

Accordingly, in a first aspect, the invention makes use of stitchable electrical components having flexible, conductive leads and encased, at least partially, in watertight packages. To form a circuit, the leads are conductively stitched to a textile panel so as to afford insulation space between the leads, and traces are stitched between at least some of the leads so as to form an electrical circuit.

In a second aspect, a multi-level circuit is created by stitching conductive traces on a second textile panel, bringing the panels into alignment, disposing a nonconductive sheet between the panels, and establishing electrical connections between the traces of the first panel and the traces of the second panel at selected points of overlap therebetween by conductively stitching the traces together at these points.

As used herein, the term "stitching" refers broadly to any form of sewing on a textile (i.e., a pre-existing matrix of woven fibers), whether for purposes of attachment to the textile or creation of a path or "trace" along the textile. Accordingly, stitching includes, without limitation, sewing, embroidery, couching, weaving, knitting, braiding, and needlepunching.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
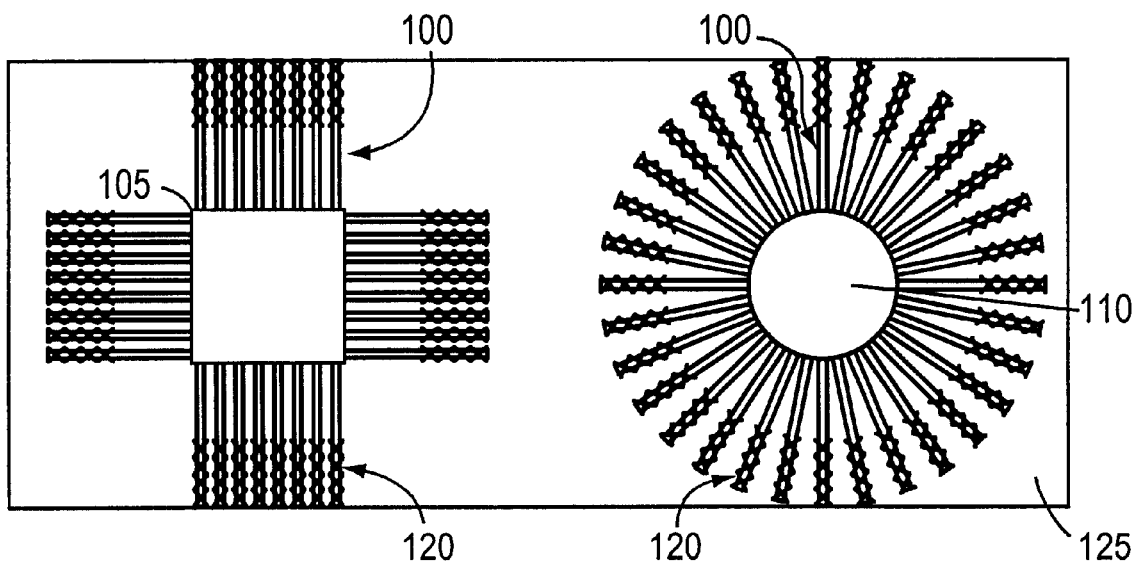
FIG. 1 is a plan view of two circuit components and accompanying traces in accordance with the present invention.

With reference to FIG. 1, electronic components in accordance with the present invention have stitchable conductive leads 100 emanating from a central package 105, 110, which contains the electronic element (or a portion thereof)—preferably in a watertight seal. In order to endure the stresses to which fabrics (particularly clothing) are commonly subjected, the leads should be highly flexible (i.e., have insufficient stiffness to retain an imposed bend or shape) and durable (i.e., resist fatigue and fraying under repeated flexure). These properties are also required of the threads 120, which are used to stitch the leads 100 to a fabric substrate 125 and also to form traces connecting circuit elements; but threads 120 must also be amenable to stitching.

In theory, the same type of conductive thread could be used both for leads 100 and for stitching. This may not be feasible as a practical matter, however, due to constraints associated with stitching, on the one hand, and component fabrication on the other. As a thread is sewn into fabric, tensions are imposed unevenly over its cross-section. Threads spun from short (staple) fibers are able to accommodate this variation in tension by stretching more on one side than the other, and manage to rebalance the tension within a short stretch of thread. Consequently, uneven stresses propagate only over short distances in staple yarns.

A bundle of continuously drawn steel fibers having relatively long individual lengths (i.e., meters instead of centimeters) is therefore not suitable for stitching. Stresses would not remain local to a small region of sewing and tensions would rapidly mount without resolution, causing the thread to bunch as it feeds through a sewing machine. But this type of fiber bundle is well-suited to use as component leads 100, particularly where the leads are welded within the package as described below. Suitable fiber bundles contain individual fibers ranging in size from 2 $\mu$m to 100 $\mu$m, with 10 $\mu$m preferred. A representative fiber bundle contains on the order of 100 fibers. Steel (or a steel composite) is a preferred material due to its strength, resistance to corrosion, biological inertness, and economical availability. Such fiber bundles are available commercially; indeed, the process by which a bundle of fine metal fibers may be drawn continuously and simultaneously from source metals is described in U.S. Pat. No. 2,050,298 (entitled "Bundle Drawing to Produce Metallic Fibers").

Threads 120, by contrast, may comprise bundles of metal and non-metal fibers spun into a sewable yarn. Various of the BEKINTEX composite yarns and BEKINOX non-composite yarnssupplied by Bekaert Fibre are suitable for tacking leads 100, for stitching traces in fabric, and for supporting welded connections to component leads. For example, a preferred yarn is spun from a mixture of 70% polyester fibers and 30% steel fibers, the fiber lengths averaging about 3 cm. Threads such as these are not easily and reliably welded, however, and therefore are not preferred for use as component leads.

Instead, we prefer a material amenable to use both as component leads and as stitched traces: an all-metal yarn spun from short (centimeter-scale) metal fibers. The optimum length of the fibers is chosen to balance the effects of stress propagation over long distances and the tendency of stiff fibers to fail to interlock at excessively short distances. One such material is Bekaert 15/1, a two-ply yarn spun entirely from short steel fibers. This yarn may be embroidered into a non-conductive fabric substrate, forming conductive traces to which component lead threads may be directly welded.

A particularly effective technique combines the use of continuous-filament steel yarn as component leads, with conductive traces sewn using this all-steel staple yarn and patterned into a non-conductive substrate. Spot welds join combinations of leads and traces to provide mechanical support for components as well as electrical continuity.

This technique is successful because it exploits the strengths of different yarns. Continuous-filament steel yarns are used as component leads because of their high tensile strength and tendency not to fray (which would promote inter-lead short circuits). Staple-fiber all-steel and composite-steel yarns are used to pattern traces because of their greater flexibility and their sewability. Component-trace connections are made by spot welding continuous-filament leads to all-steel yarn traces in the substrate. Finally, components are mechanically secured to the substrate by single or multiple lead penetration—that is, component leads are punched through the substrate at least once before attachment to traces in order to constrain component placement on the substrate.

The number of leads 100 that may emerge from a given electronic component depends on the geometry of the component package, the properties of the leads, the tacking stitches used to anchor them to fabric, and the stresses the fabric is likely to undergo during use. Given a lead spacing s at the periphery of a package and a package diameter d (for a round package 110) or a side length l (for a square package 105), the maximum number of leads n that the package can support is given by $$n_{square} = 4\left(\frac{l}{s} - 1\right)$$

$$n_{round} = \frac{\pi d}{s}$$

Given these purely geometric constraints, it is clear that for components having large numbers of leads, smaller package sizes can be achieved with square, rather than round packages. But for components having less than 16 leads, the round package offers greater size efficiencies.

Beyond geometry, however, considerations relating to use and durability tend to favor round packages. The compression and shear forces operating on articles of clothing, for example, tend to be randomly oriented and to vary haphazardly over time. These tend to shift the positions of stitched components, placing stress on leads opposed to the shift. Because the leads from a round package radiate in all directions, the forces actually experienced by the package tend to average out, restoring it to its original position. This is not the case for polygonal packages, in which the leads extend, in parallel, transversely from each straight side.

Moreover, the radial pattern formed by the leads from a round package ensures that the spacing between them increases with distance from the package; by contrast, as shown in FIG. 1, the lead spacing from a rectangular or square package 105 is unchanged along the lengths of the leads. Greater lead spacing favors durability, since the conductive fibers of the leads 100 (or the traces 120) can fray over time. If the leads are too close together, shorting can occur between the frays or "fuzz" of adjacent leads. The finest practical lead spacing thus far employed has been 0.05 inch, which, for a 16-lead package, implies a package diameter of 0.254 inch. It is reasonable to expect that an electronic element of about half this size (in terms of area) will fit into the package, resulting in about 10 mm² of usable chip "real estate" for a typical sewable button package.

Figure 2:
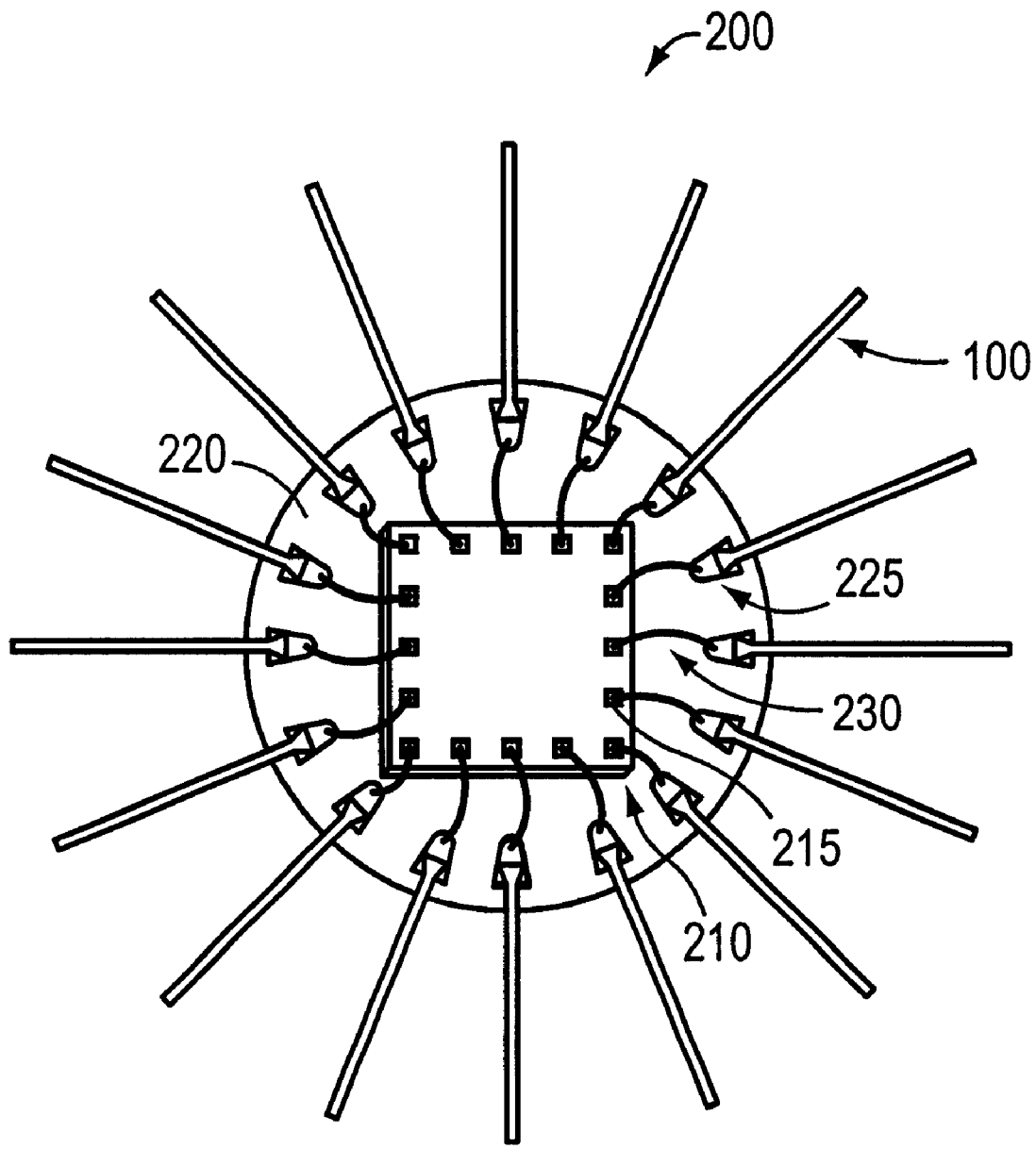
FIG. 2 is a plan view of a partially fabricated circuit component as illustrated in FIG. 1.

The fabrication of such a package is illustrated in FIG. 2. The operative elements of the package, indicated generally at 200, include an integrated circuit (IC) 210 whose terminals are arranged around its perimeter as a series of bond-out pads 215 that receive electrical connections. The IC 210 is affixed to a leadframe 220 (usually by way of a metal base beneath IC 210 that helps keep the IC at a near-uniform temperature and electrical potential across its area). The leadframe 220 has at least as many stubs 225 as there are bond-out pads 215. Each bond-out pad 215 is connected to a stub 225, which also receives a lead 100 as previously described.

The connection between bond-out pads 215 and stubs 225 may be effected in a conventional fashion, e.g., using fine gold wires 230 bonded by thermocompression to bond-out pads 215 (which are typically gold) and stubs 225 (which may be copper). The fiber bundles constituting leads 100 are microspotwelded onto bond-out pads 215. The weld schedule (i.e., voltage-time profiles at the welding electrode) depends on such factors as the electrode geometry, contact area, and electrode-workpiece metallurgy, and for purposes of the present invention is optimized to maximize the pull strength of the lead-leadframe junction. An optimal weld schedule for a given application is straightforwardly determined without undue experimentation by those skilled in the art. To prevent interference from fraying, the end of the fiber bundle may be initially welded flat by one or two welding operations, and cut to form a tab.

Following affixation of leads 100 to bond-out pads 225, the entire leadframe 220 is hermetically sealed, e.g., in a polymeric capsule (typically an epoxy resin) with the leads arranged in a radial pattern. So long as the capsule extends beyond the perimeter of leadframe 220, water or other contaminants will not penetrate the sealed assembly to damage IC 210 or the connections thereto. Accordingly, textiles equipped with electronic components fabricated as set forth herein can be washed, dry-cleaned, or otherwise laundered without damage to the electrical integrity of the circuit or its components.

Depending on size constraints, it may be desirable to bond leads 100 directly to the bond-out pads 215 of IC 210 without using an intermediate leadframe 220. For conventional ICs, this would require the use of leads metallurgically compatible with the bond-out pads and a bonding process less traumatic to the crystalline IC substrate than thermocompression of a fiber bundle.

Traces 120 are stitched along fabric panel 125, interconnecting components sewn thereto, furnishing power to these components, and facilitating interaction with the user and/or his environment. For example, sensors and user-actuable switches can take the form of traditional fabric fasteners: snaps, zippers, studs, buttons, grommets, staples, conductive hook-and-pile materials, or hook-and-eye fasteners—essentially any electrically conductive component that can pierce or otherwise establish electrical contact with traces 120. Furthermore, fasteners may be chosen to confer a desired electrical property, e.g., resistance, capacitance, or nonlinear conductance.

As in any electrical circuit, the pattern of traces 120 and the components they interconnect are dictated primarily by electronic function but aesthetic or structural considerations involving the fabric article itself also enter into play. For example, to the extent that traces 120 can follow ordinary seam lines or be hidden within folds, the visual impact of the circuit will be mitigated; on the other hand, it might be desired to have the traces fully visible as design elements. Alternative modes of construction are also possible. For example, traces 120 may be replaced with strips of conductive material sewn or otherwise attached (e.g., by adhesive) to panel 125, or may instead be integral within the weave of panel as in an organza fabric (discussed in the '466 application). Obviously, combinations of these approaches are feasible as well.

Figure 3:
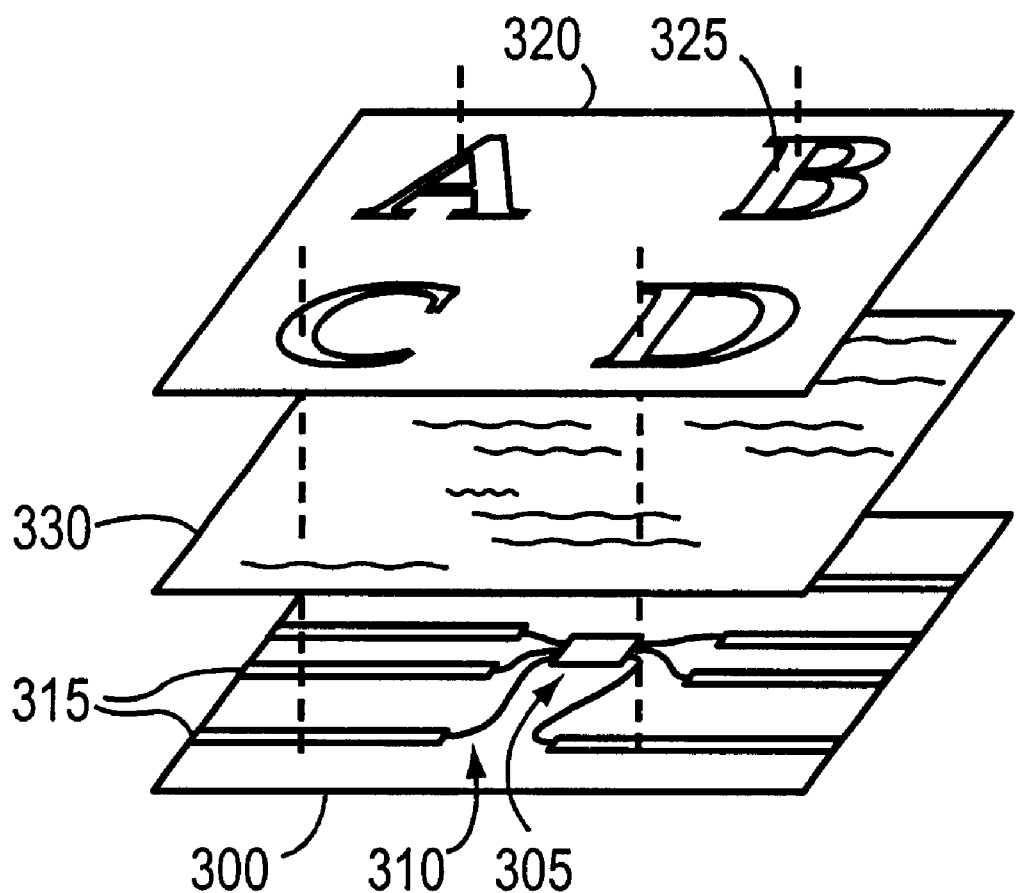
FIG. 3 is an exploded, partially schematic view of a multiple-layer, textile-based circuit in accordance with the present invention.

A circuit in accordance with the invention can also be realized in multiple layers, which behave structurally as fabric plies or layers, and electronically as separate strata of multiple-level circuit boards. An exemplary approach to multiple-layer construction is shown in FIG. 3, in which a bottommost fabric panel 300 contains an electronic component 305 in accordance with the present invention. A series of leads 310 emanate from component 305 and are tacked into panel 300 by stitching that extends into a series of conductive traces 315. A topmost panel 320 contains a series of electrodes representatively indicated at 325; these may, for example, be formed by embroidery using conductive thread. Panels 300, 320 are aligned such that each electrode 325 overlies the trace 315 to connection is desired. An electrically insulating panel 330 is disposed between panels 300, 320, and connections between the electrodes 325 and traces 315 are effected, as indicated by the dashed lines, by conductive thread sewn through all three layers 300, 320, 330. Of course, this concept can be extended to numerous layers as dictated by electrical and structural design needs.

For some applications, an alternative to multiple-layer construction is to utilize, for the traces, conductive thread or yarn coated with an insulating material (which is removed where the traces are to make electrical contact with operative components or other traces). In this way, the traces can cross one another without shorting.

Power can be supplied to fabric circuitry in any number of ways. Most simply, a battery pack may simply be associated with the fabric, either by direct attachment of a battery holder (which may be sealed in a watertight fashion) or indirectly by means of conventional connectors that couple to an external source of power. In the latter case, a wearer of an electrically active garment might, for example, carry a battery pack clipped to his belt and connected to the garment during use. When not in use, the battery pack is disconnected, allowing the garment to be laundered.

Alternatively, the garment may receive power without mechanical coupling by means of intra-body electrical transmission as described, for example, in copending application Ser. no. 08/965,465, filed on Nov. 6, 1997 and hereby incorporated by reference. In this case, power is transmitted via capacitive coupling through the wearer's body. The power can again originate with a battery pack or, more preferably, with shoes adapted to convert some of the mechanical energy associated with walking to electrical energy (as described in the '465 application). Capacitive coupling through the body can also be used to permit different garments worn by the same person to communicate with one another.

Indeed, the applications to which the present invention is suited can include networks of computing elements, distributed over a single garment and intercommunicating by means of conductive traces and/or in separate garments and communicating electrostatically. Such garments could, for example, record and store environmental information (or even images), and then be "docked" later to an external host computer to which this information is downloaded.

Other modes of power transmission include harnessing the triboelectric charges accumulating during ordinary usage of fabrics, some of which acquire static fields quite easily. This electric charge is rectified and stored for use by the fabric-bound electronic components. Another approach is to utilize the fabric panels themselves (or portions thereof) as the plates of an electrolytic cell; when brought into contact with a liquid electrolyte, the plates function as a battery, providing power to electronic components. This approach may be used, for example, in a diaper; the presence of urine, an electrolyte, causes power to be supplied to a transmitter, which issues an alert signal to a receiver indicating the need to change the diaper. The transmitter components could be sewn directly into the diaper or, more realistically in the case of disposable diapers, may be provided as a permanent package that is affixed to the one of the hook-and-pile fastening strips of each diaper as it is used. Electrically conductive hook-and-pile material is commercially available, and can afford the means by which the transmitter is removably connected to the diaper and, hence, to the electrolytic cell components.

It will therefore be seen that the foregoing represents a new approach to the integration of electronics with traditional textiles that does not compromise the structural characteristics or washability of the latter. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of creating an electric circuit on a textile, the method comprising the steps of:
   a. providing at least one electrical component comprising:
      i. an electronic element comprising a plurality of terminals;
      ii. connected to each terminal, a flexible conductive fiber lead for establishing electrical connection to the terminal, the leads having lengths; and
      iii. a package surrounding at least a portion of the element and a portion of the lengths of the leads;
   b. conductively joining the leads to the textile in a pattern affording insulation space between the leads; and
   c. joining conductive traces between at least some of the stitched leads so as to form an electrical circuit.

2. The method of claim 1 wherein at least some of the components comprise round packages, the leads extending radially from the package and being stitched in a radial pattern on the textile.

3. The method of claim 1 wherein at least some of the components comprise polygonal packages having a plurality of straight sides from which leads extend, the leads originating with each side of the package being stitched in parallel on the textile so as to extend transversely from said side.

4. The method of claim 1 wherein the package has a perimeter, the leads being spaced around the perimeter at least 0.05 inch from each other.

5. The method of claim 1 wherein the leads comprise bundles of corrosion-resistant metal fibers each no greater than 10 $\mu$m in diameter, the leads having insufficient stiffness to retain bends and resisting fatigue under repeated flexure.

6. The method of claim 5 wherein the fibers are steel.

7. The method of claim 1 wherein the traces are stitched with thread comprising conductive fibers and nonconductive fibers, the thread having insufficient stiffness to retain bends and resisting fatigue under repeated flexure.

8. The method of claim 1 wherein the leads comprise, and the traces are stitched with, thread spun from short conductive fibers, the thread having insufficient stiffness to retain bends and resisting fatigue under repeated flexure.

9. The method of claim 1 wherein at least some of the components are assembled according to steps comprising:
   a. providing an integrated circuit having a plurality of bond-out pads;
   b. disposing the integrated circuit on a leadframe comprising a plurality of stubs;
   c. connecting each bond-out pad to a leadframe stub;
   d. connecting each of the leads to a bond-out pad connected to a leadframe stub; and
   e. hermetically encapsulating the leadframe within a polymeric carrier.

10. The method of claim 9 wherein the leads are welded to the bond-out pads.

11. The method of claim 1 wherein steps (a)–(c) are carried out on a first textile panel, and further comprising the steps of:

a. creating a second circuit on a second textile panel, the circuit comprising stitched conductive traces;
  b. bringing the panels into alignment;
  c. disposing a nonconductive sheet between the panels; and
  d. establishing electrical connections between the traces of the first panel and the traces of the second panel at selected points of overlap therebetween by conductively stitching the traces together at said points.

12. The method of claim 1 wherein the traces are stitched with conductive thread comprising an insulating coating thereon, at least some of the traces crossing other traces without electrical communication therebetween.

13. The method of claim 1 wherein at least some of the electrical components are processors, the traces linking the processors together as a computer network.

14. The method of claim 1 further comprising the step of powering the electrical elements using current generated by triboelectric charging.

15. The method of claim 1 further comprising the step of powering the electrical elements by means of a battery removably connected to the circuit.

16. The method of claim 1 further comprising the step of powering the electrical elements by means of a sealed battery connected to the circuit.

17. The method of claim 1 further comprising the step of powering the electrical elements by means of current transmitted from a power source through a wearer's body to the circuit.

18. The method of claim 1 wherein the traces are stitched and the leads are stitched to the traces.

19. The method of claim 1 wherein the traces are stitched and the leads are welded to the traces.

* * * * *